US011876001B2

(12) United States Patent
Gong et al.

(10) Patent No.: US 11,876,001 B2
(45) Date of Patent: Jan. 16, 2024

(54) METHOD AND SYSTEM FOR MANUFACTURING SEMICONDUCTOR LAYER

(71) Applicant: NEXCHIP SEMICONDUCTOR CORPORATION, Anhui (CN)

(72) Inventors: Baoyou Gong, Anhui (CN); Chih-Hsien Huang, Anhui (CN); Jian-Zhi Fang, Anhui (CN); Cheng-Xian Yang, Anhui (CN)

(73) Assignee: NEXCHIP SEMICONDUCTOR CORPORATION, Hefei (CN)

( * ) Notice: Subject to any disclaimer, the term of this patent is extended or adjusted under 35 U.S.C. 154(b) by 364 days.

(21) Appl. No.: 17/379,922

(22) Filed: Jul. 19, 2021

(65) Prior Publication Data

US 2022/0076966 A1 Mar. 10, 2022

(30) Foreign Application Priority Data

Sep. 9, 2020 (CN) .......................... 202010937773.8

(51) Int. Cl.
*H01L 21/3205* (2006.01)
*C23C 16/455* (2006.01)
*H01L 21/67* (2006.01)
*H01L 21/687* (2006.01)

(52) U.S. Cl.
CPC .. *H01L 21/32051* (2013.01); *C23C 16/45519* (2013.01); *H01L 21/67248* (2013.01); *H01L 21/687* (2013.01)

(58) Field of Classification Search
CPC ......... H01L 21/32051; H01L 21/67248; H01L 21/687; H01L 21/2855; H01L 21/67109; H01L 21/02697; H01L 21/67011; H01L 21/67207; C23C 16/45519; C23C 14/14; C23C 14/54; C23C 14/56
See application file for complete search history.

(56) References Cited

U.S. PATENT DOCUMENTS

2003/0022487 A1* 1/2003 Yoon ................. H01L 21/28518
438/642
2007/0144892 A1* 6/2007 Shih ..................... H01L 21/2855
204/192.15

FOREIGN PATENT DOCUMENTS

CN 103184427 * 7/2013

OTHER PUBLICATIONS

CN103184427 machine translation (Year: 2013).*

* cited by examiner

*Primary Examiner* — Yasser A Abdelaziez

(57) ABSTRACT

The present disclosure provides a method and system for manufacturing a semiconductor layer. The method includes: placing a first wafer in a cavity to form a metal film on the first wafer; before forming the metal film, the temperature inside the cavity is a first temperature; transferring the first wafer on which the metal film has been formed out of the cavity; the temperature in the cavity is a second temperature, and the second temperature is greater than the first temperature; introducing an inert gas into the cavity to cool the cavity, such that the temperature in the cavity is equal to the first temperature; after the temperature in the cavity is equal to the first temperature, placing a second wafer in the cavity to form the metal film on the second wafer. The manufacturing method can reduce the defects on the surface of the metal film.

10 Claims, 4 Drawing Sheets

METHOD AND SYSTEM FOR MANUFACTURING SEMICONDUCTOR LAYER

BACKGROUND

Field of Disclosure

The present disclosure relates to the technical field of semiconductor, in particular, to a method and system for manufacturing semiconductor layers.

Description of Related Arts

In the process of depositing and forming aluminum-copper films on the wafer, the inner stress of the aluminum-copper material is constantly being compressed. The formation of a thick aluminum-copper film on the wafer requires multiple deposition processes over a long period in the reaction chamber. The wafer is constantly in an environment with high power and increasing temperature, thus will inevitably be heated to a very high temperature. Therefore, the inner stress of the aluminum-copper film can only be relieved by forming protruding crystal whiskers on the surface. When the reaction chamber is used to continuously deposit aluminum-copper films on different wafers, working in a high-temperature and high-pressure environment for a long time would further increase the temperature of various components (including shielding layer, ring and susceptor, etc.) in the reaction chamber. As a result, the temperature of the wafer currently being deposited in the reaction chamber continues to rise, which eventually leads to more serious crystal whisker-like defects forming on the surface of aluminum-copper film. Thus, the performance of the semiconductor cannot be guaranteed.

At the same time, the deposition process used in the traditional technology will also cause damage to the reaction chamber and its internal components due to long-term exposure to a harsh environment of high temperature and high pressure, which will reduce the service life of the semiconductor device.

SUMMARY

The present invention provides a method for manufacturing a semiconductor layer, to suppress the defects on the surface of the semiconductor layer, thereby improving the yield of semiconductor devices.

The present disclosure provides a method for manufacturing a semiconductor layer, including:
  placing a first wafer in a cavity to form a metal film on the first wafer; before forming the metal film, the temperature inside the cavity is a first temperature;
  transferring the first wafer on which the metal film has been formed out of the cavity; a temperature in the cavity is a second temperature, and the second temperature is greater than the first temperature;
  introducing an inert gas into the cavity to cool the cavity, such that the temperature in the cavity is equal to the first temperature;
  after the temperature in the cavity is equal to the first temperature, placing a second wafer in the cavity to form the metal film on the second wafer.

Further, the operation of forming the metal film on the first wafer includes:
  placing the first wafer on a chuck in the cavity;
  introducing a gas into the cavity;
  depositing the metal film.

Further, the time for forming the metal film on the first wafer is between 50-60 s.

Further, the thickness of the metal film is between 8000-10000 angstroms.

Further, the inert gas includes argon, helium or nitrogen.

Further, the time for introducing the inert gas into the cavity is between 10-20 s.

Further, the operation of forming the metal film on the first wafer is identical to the operation of forming the metal film on the second wafer.

Further, the metal film may be an aluminum film, a titanium film, or a copper film.

Further, the first temperature is between 280-300° C., and the second temperature is between 301-350° C.

Furthermore, the present disclosure also provides a system for manufacturing a semiconductor layer, including:
  a deposition unit, comprising a cavity, an external gas source, and a temperature sensing unit;
  the external gas source is provided on the cavity to introduce a gas into the cavity; the temperature sensing unit is provided in the cavity to measure a temperature in the cavity;
  when a first wafer is provided in the cavity, a temperature in the cavity measured by the temperature sensing unit is a first temperature; after a metal film is formed on the first wafer, a temperature in the cavity measured by the temperature sensing unit is a second temperature;
  after the first wafer is removed, an inert gas is introduced into the cavity to cool the cavity; when the temperature in the cavity measured by the temperature sensing unit is equal to a first temperature, a second wafer is placed in the cavity to form the metal film on the second wafer.

In conclusion, the present disclosure provides a method and system for manufacturing a semiconductor layer. After a metal film is formed on the first wafer, the cavity is cooled by an inert gas so that the temperature of the cavity becomes the temperature when the first wafer is provided in the cavity. Then, the second wafer is provided in the cavity to form a metal film on the second wafer. When the second wafer is provided in the cavity, since the temperature of the cavity decreases, the thermal stress of the second wafer is reduced. Therefore, the grain size of the metal film formed on the second wafer becomes smaller, which effectively inhibits the surface defects on the metal film. Through measurement, it is known that the reflectance of the metal film is increased, that is, the defects on the metal film surface are reduced, thus the yield of the semiconductor device is improved. In the present disclosure, the cavity is cooled after being used for a period of time, so that the service life of the cavity can be increased.

DESCRIPTION OF REFERENCE NUMERALS

Figure 1:
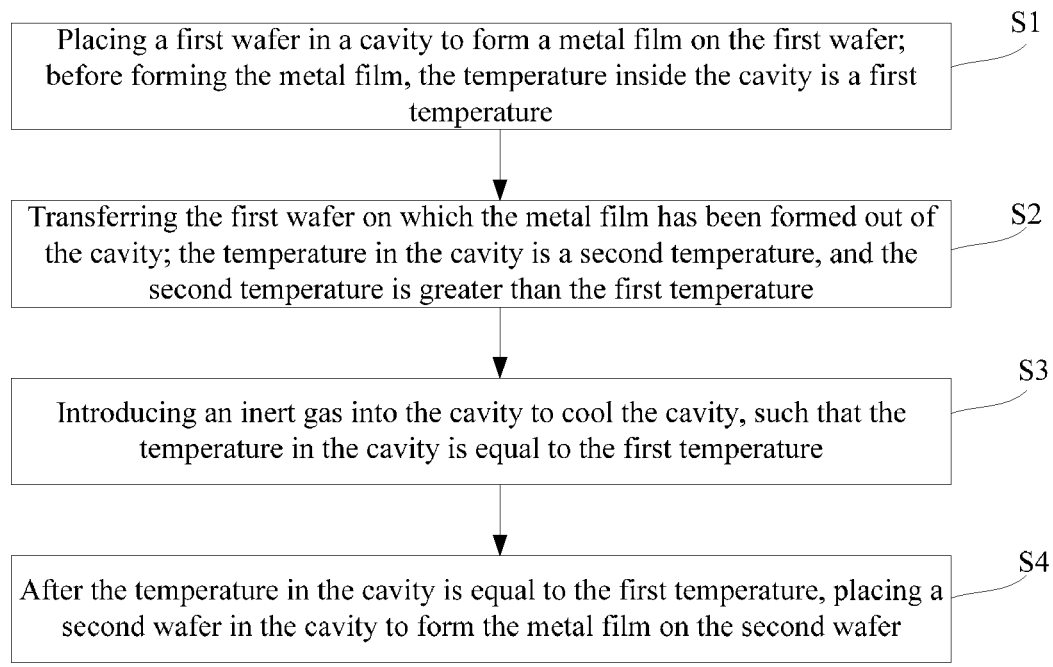
FIG. 1 is a flow chart of a method for manufacturing a semiconductor layer according to the present disclosure.

100 Semiconductor device
101 Cavity
102 Chuck
103 External gas source
104 Air extracting pump
105 Temperature sensing unit
11 First wafer
12 Second wafer
20 Aluminum film
30 Deposition unit
31 First deposition unit
32 Second deposition unit

DETAILED DESCRIPTION OF THE PREFERRED EMBODIMENTS

The embodiments of the present disclosure will be described below. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during the actual implementation thereof may be freely changed, and the component layout configuration thereof may be more complex.

Figure 2:
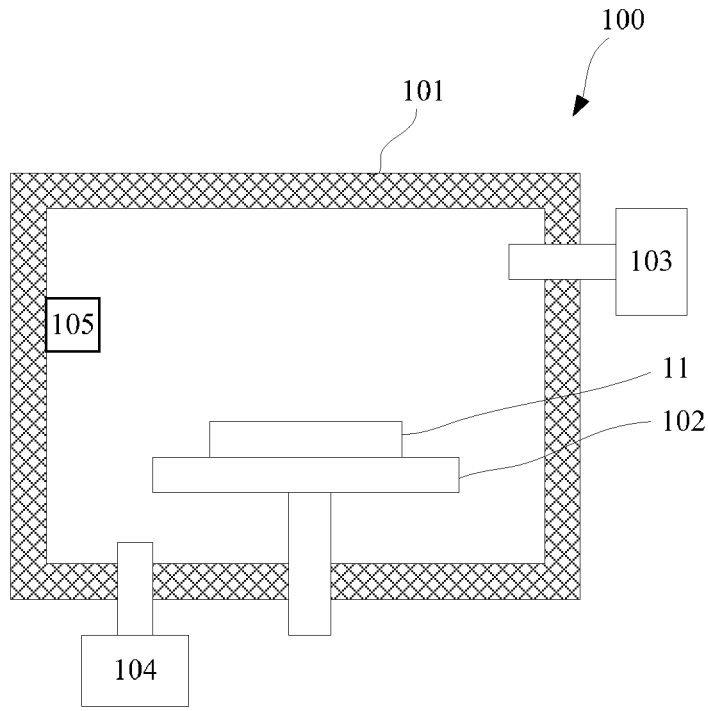
FIG. 2 is a structural diagram corresponding to operation S1.

As shown in FIG. 1, this embodiment provides a method for manufacturing a semiconductor layer, including:

S1: placing a first wafer in a cavity to form a metal film on the first wafer; before forming the metal film, the temperature inside the cavity is a first temperature;

S2: transferring the first wafer on which the metal film has been formed out of the cavity; the temperature in the cavity is a second temperature, and the second temperature is greater than the first temperature;

S3: introducing an inert gas into the cavity to cool the cavity, such that the temperature in the cavity is equal to the first temperature;

S4: after the temperature in the cavity is equal to the first temperature, placing a second wafer in the cavity to form the metal film on the second wafer;

As shown in FIG. 2, in operation S1, a first wafer 11 is provided first, and the first wafer 11 is provided in a semiconductor device 100. The semiconductor device 100 includes a cavity 101, a chuck 102, an external gas source 103, an air extracting pump 104 and a temperature sensing unit 105.

As shown in FIG. 2, in this embodiment, the chuck 102 is provided in the cavity 101 and may be provided at the bottom of the cavity 101. The diameter range of the chuck 102 is, for example, 200 mm-800 mm, such as 400-600 mm. In some embodiments, the size of the chuck 102 is, for example, 2-12 inches, such as 4 inches, 6 inches, 8 inches, 10 inches, 12 inches, or other sizes. The chuck 102 may be made of a variety of materials, including silicon carbide or graphite coated with silicon carbide. In some embodiments, the chuck 102 includes silicon carbide material and has a surface area of 2000 square centimeters or more, for example, 5000 square centimeters or more, and for another example, 6000 square centimeters or more. In this embodiment, a plurality of first wafers 11 are allowed on the front surface of the chuck 102, for example, four or six or more or fewer first wafers 11 may be placed. In this embodiment, one first wafer 11 is provided on the chuck 102.

As shown in FIG. 2, in this embodiment, the external gas source 103 may be provided on the top of the cavity 101. The external gas source 103 is connected with the cavity 101 through an air inlet. The gas in the external gas source 103 is introduced into the cavity 101 through the air inlet. The gas in the external gas source 103 includes at least argon, nitrogen or helium. The air extracting pump 104 is also provided at the bottom of the cavity 101. The air extracting pump 104 is connected with the cavity 101 through an air outlet to vacuum the cavity 101. The temperature sensing unit 105 may be provided on the top of the cavity 101, and the temperature sensing unit 105 measures the temperature in the cavity 101.

As shown in FIG. 2, in this embodiment, the first wafer 11 is, for example, silicon, germanium, silicon germanium, silicon carbide, gallium arsenide, or indium gallium. The first wafer 11 may also be a silicon-on-insulator substrate or a germanium-on-insulator substrate.

In some embodiments, the first wafer 11 may include sapphire, silicon carbide, silicon, gallium nitride, diamond, lithium aluminate, zinc oxide, tungsten, copper and/or aluminum gallium nitride. The first wafer 11 may also be, for example, soda-lime glass and/or high-silica glass. Generally speaking, the first wafer 11 may be composed of the following: materials with compatible lattice constants and thermal expansion coefficients, and a substrate compatible with the group III-V materials grown thereon, or a substrate that is thermally and chemically stable at III-V growth temperatures. The diameter of the first wafer 11 may range from 50 mm to 100 mm (or more). In some embodiments, the diameter of the first wafer 11 is, for example, 2-12 inches, such as 4 inches, 6 inches, 8 inches, 10 inches, 12 inches, or other sizes.

It should be noted that a target and a magnet are also provided in the cavity 101, and the target and the magnet may be located just above the chuck 102. In some embodiments, the target may be formed of a material selected from but not limited to the following groups: substantially pure aluminum, aluminum-containing alloy, aluminum-containing compounds (such as AlN, AlGa, $Al_2O_3$) and aluminum-containing targets doped with II/IV/VI elements to improve layer compatibility and device performance. The processing gas used during the sputtering process may include, but is not limited to, nitrogen-containing gas and inert gas. The nitrogen-containing gas may be nitrogen ($N_2$), ammonia ($NH_3$), nitrogen dioxide ($NO_2$), or nitrogen oxide (NO). The inert gas may be argon (Ar), neon (Ne), or krypton (Kr).

Figure 3:
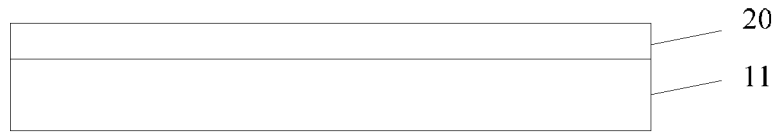
FIG. 3 is a schematic diagram showing the structure of an aluminum film forming on the first wafer.

As shown in FIGS. 2 to 3, after the first wafer 11 is provided on the chuck 102, the external gas source 103 introduces gas into the cavity 101 through the air inlet, and then a voltage is applied to the target for the deposition operation. In this embodiment, the material of the target may be aluminum, the gas introduced may be argon, and an aluminum film 20 may be formed on the first wafer 11. In this embodiment, the thickness of the aluminum film may be between 8000-10000 angstroms, for example, 8000 angstroms, 9000 angstroms, or 10000 angstroms. The deposition time of the aluminum film may be between 50-60 s, for example, 50 s or 60 s. Before the deposition operation, whether the first wafer 11 is fixed on the chuck 102 may be checked. During the deposition operation, the chuck 102 may be rotated to improve the thickness uniformity of the aluminum film 20.

As shown in FIGS. 2 to 3, in this embodiment, when the material of the target is titanium or copper, a titanium film or copper film may be formed on the first wafer 11. When the introduced gas includes nitrogen-containing gas, an ALN film or TIN film may be formed on the first wafer 11. It should be noted that during forming aluminum film, titanium film or copper film, heating of cavity 101 is also required, so the temperature in the cavity 101 will increase to a stable value.

Figure 4:
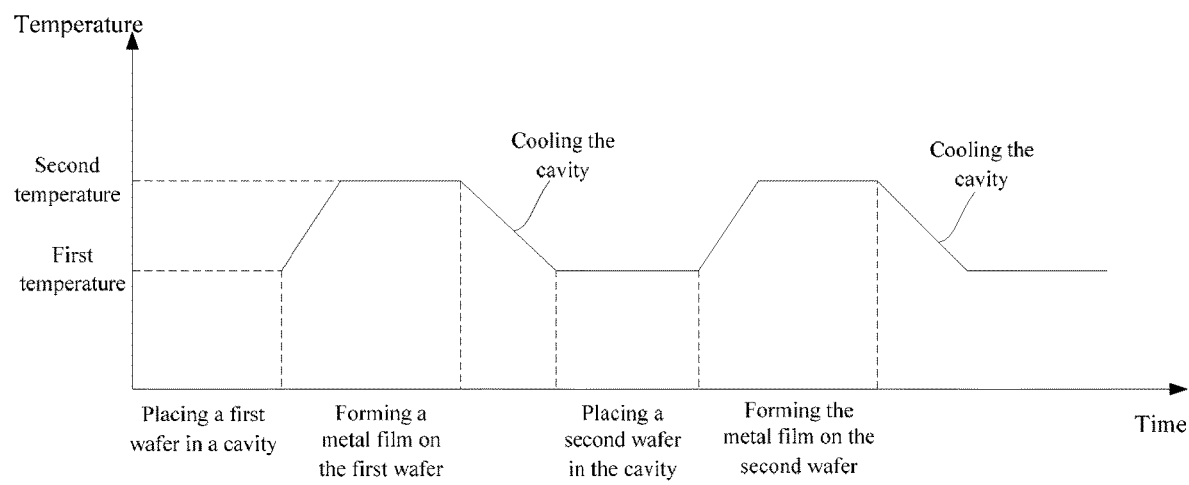
FIG. 4 is a schematic diagram showing the temperature change in the cavity.

As shown in FIGS. 2 and 4, in this embodiment, when the first wafer 11 is provided in the cavity 101, that is, when the first wafer 11 is fixed on the chuck 102, the temperature in the cavity 101 measured by the temperature sensing unit 105 is the first temperature. Then, depositing on the surface of the first wafer 11, to form a metal film on the first wafer 11. During the formation of the metal film, the cavity 101 begins to be heated up. When the temperature in the cavity 101 increases to the second temperature, that is, the temperature of the cavity 101 measured by the temperature sensing unit 105 is the second temperature, the temperature is maintained for a certain period of time to form a metal film on the first wafer 11. The metal film may be an aluminum film, a titanium film, a copper film, or other metal films. After the metal film is formed on the first wafer 11, the temperature in the cavity 101 is increased from the first temperature to the second temperature. The first temperature is, for example, 280-300° C., such as 300° C.; the second temperature is, for example, 301-350° C., such as 320° C.

Figure 5:
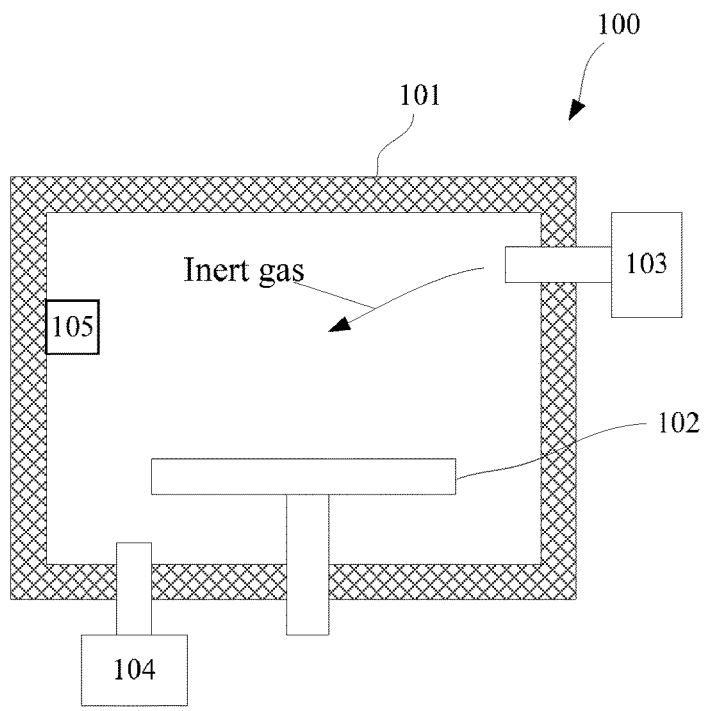
FIG. 5 is a structural diagram corresponding to operation S3.

As shown in FIGS. 4 to 5, in operations S2-S3, after the metal film is formed on the first wafer 11, the first wafer 11 is transferred out of the cavity 101. At this time, the temperature in the cavity 101 is the second temperature. Then the cavity 101 is cooled. In this embodiment, the cavity 101 may be cooled by an inert gas. For example, an inert gas may be introduced into the cavity 101 by an external gas source 103 to cool the cavity 101. The air extracting pump 104 works when the inert gas is introduced. In this embodiment, the time for introducing the inert gas is, for example, 10-15 s, such as 10s or 12s. In this embodiment, the inert gas may include argon, helium, nitrogen, neon, krypton, and so on. The inert gas may enter the cavity 101 from the top of the cavity 101 and be pumped away from the bottom of cavity 101 by the air extracting pump 104.

As shown in FIG. 5, in this embodiment, since the external gas source 103 contains argon, nitrogen or helium, argon may be introduced into the cavity 101 for cooling. Of course, the cooling may also be carried out with nitrogen or helium. Of course, for cost and safety reasons, argon may be used.

As shown in FIGS. 4 to 5, after the cavity 101 is cooled, the temperature in the cavity 101 decreased from the second temperature to the first temperature. That is, the temperature in the cavity 101 becomes the temperature when the first wafer 11 is provided in the cavity 101, thereby ensuring that the environment in the cavity 101 is consistent with the environment when the first wafer 11 is provided in the cavity 101.

Figure 6:
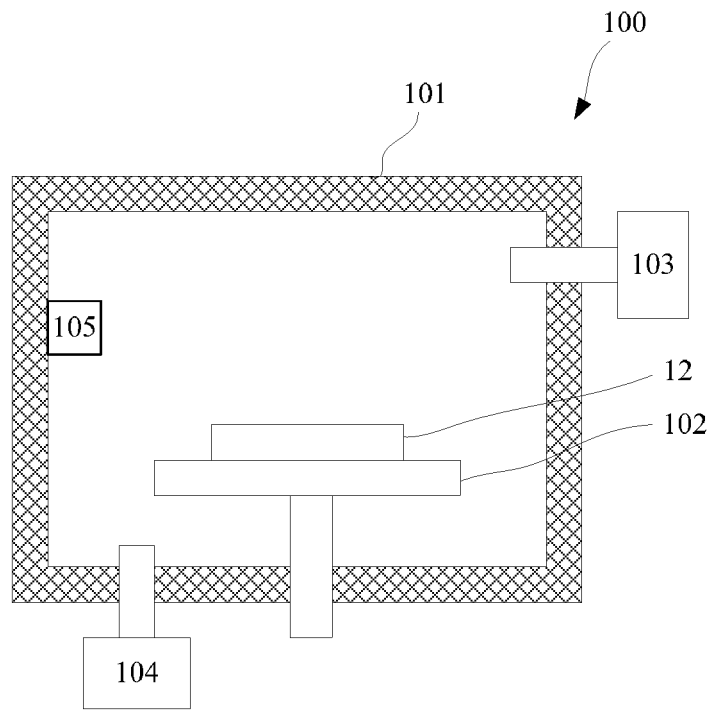
FIG. 6 is a structural diagram corresponding to operation S4.

As shown in FIG. 6, in operation S4, when the temperature sensing unit measures that the temperature in the cavity 101 is the first temperature, the second wafer 12 is provided on the chuck 102 in the cavity 101. Then, depositing the second wafer 12 to form a metal film on the second wafer 12. The operations of forming a metal film on the first wafer 11 and the second wafer 12 are the same. In some embodiments, during the formation of the metal film, the first wafer 11 and the second wafer 12 may be in a rotating state to improve the thickness uniformity of the metal film. The metal film formed on the second wafer 12 may be an aluminum film, a titanium film, or a copper film.

Figure 7:
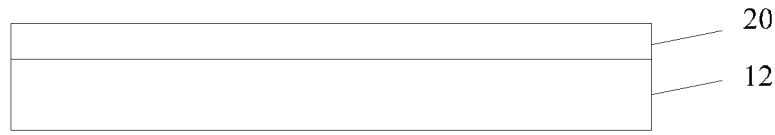
FIG. 7 is a schematic diagram showing the structure of an aluminum film forming on the second wafer.

As shown in FIGS. 4, 6 and 7, when the second wafer 12 is provided on the chuck 102 in the cavity 101, the temperature of the cavity 101 is the first temperature. When the metal film is formed on the second wafer 12, the temperature in the cavity 101 becomes the second temperature. After the metal film is formed, the second wafer 12 is removed, and the temperature of the cavity 101 is the second temperature. Then, an inert gas is introduced into the cavity 101, such that the temperature in the cavity 101 decreases from the second temperature to the first temperature. In this embodiment, before the second wafer 12 is provided in the cavity 101, the cavity 101 is cooled first, thereby reducing the temperature difference between the second wafer 12 and the cavity 101. That is, the thermal stress of the second wafer 12 is reduced. Therefore, the grain size of the metal film formed on the second wafer 12 becomes smaller, which effectively inhibits the surface defects on the metal film. If the second wafer 12 is provided in the cavity 101 for deposition directly after the metal film is formed on the first wafer 11, since the temperature in the cavity 101 is high, while the temperature of the second wafer 12 is low, the large temperature difference between the second wafer 12 and the cavity 101 would cause high thermal stress on the second wafer 12. Therefore, when the metal film is formed on the second wafer 12, the grain size of the metal film would increase, resulting in a large number of surface defects on the surface of the metal film.

As shown in FIG. 4, after the metal film is formed on the second wafer 12, the second wafer 12 is removed, and then the cavity 101 is cooled so that the temperature in the cavity 101 is reduced to the first temperature. Then, a third wafer is provided in the cavity 101 and a deposition operation is carried out, such that defects on the metal film formed on the third wafer can be reduced. Of course, in some embodiments, the cavity 101 may be cooled by cooling water.

Figure 8:
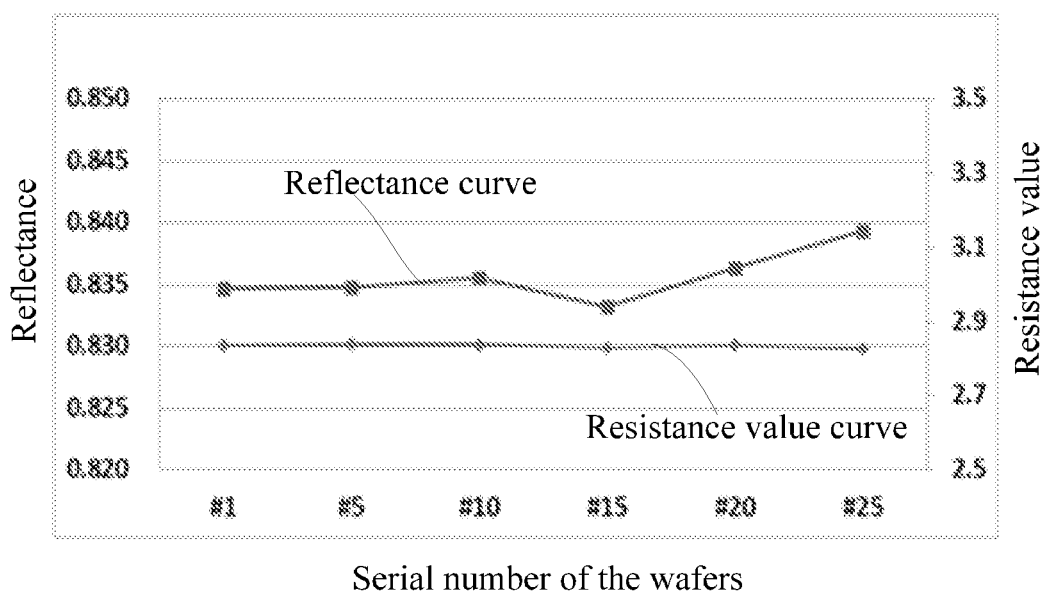
FIG. 8 is a schematic diagram showing the reflectance curve and resistance value curve of the wafer.

FIG. 8 shows the reflectance curve and resistance value curve of the wafer. As can be seen from FIG. 8, the reflectance curve of the wafer basically maintains a growing trend. The growing trend of a reflectance curve indicates that the grain size of the metal film becomes smaller, which means that the surface defects on the metal film will decrease. As can be seen from FIG. 8, the resistance value curve of the wafer remains stable, indicating that the resistance value of the wafer is basically the same; In other words, the grain size of the metal film formed on the wafer is basically the same. Therefore, before the second wafer is provided in the cavity, the cavity is cooled, such that the thermal stress of the second wafer is effectively reduced. Therefore, the grain size of the formed metal film is small, and the surface defects of the metal film are reduced.

Figure 9:
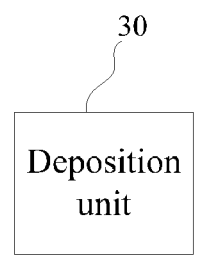
FIG. 9 is a schematic diagram of a system for manufacturing a semiconductor layer according to the present disclosure.

As shown in FIG. 9, this embodiment also provides a system for manufacturing semiconductor layers. The manufacturing system includes a deposition unit 30. The deposition unit 30 may have a structure shown in FIG. 2. That is, the deposition unit 30 may include a cavity 101, a chuck 102 located at the bottom of the cavity 101, an external gas source 103 connected with the cavity 101, an air extracting pump 104 connected with the cavity 101, and a temperature sensing unit 105 disposed in the cavity 101. The deposition unit 30 may be a physical vapor deposition reaction chamber. The wafers sequentially form films in the deposition unit 30. When the wafer is provided in the deposition unit 30 for the second time, the deposition unit 30 needs to be cooled so that the temperature in the deposition unit 30 is consistent every time a metal film is grown.

Figure 10:
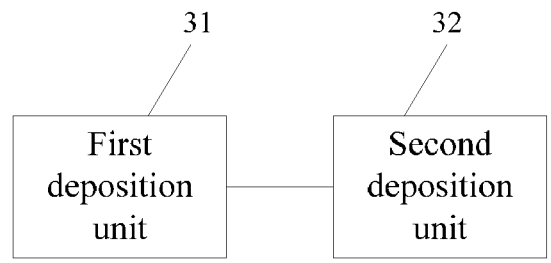
FIG. 10 is a schematic diagram of a system for manufacturing a semiconductor layer according to another embodiment of the present disclosure.

As shown in FIG. 10, in some embodiments, the manufacturing system may further include a plurality of deposition units 30, for example, a first deposition unit 31 and a second deposition unit 32. The first deposition unit 31 and the second deposition unit 32 may have a structure as shown in FIG. 2. The first deposition unit 31 and the second deposition unit 32 may respectively form different metal films on the wafer. For example, an aluminum film is formed on the first wafer 11 in the first deposition unit 31, and then the first wafer 11 is provided in the second deposition unit 32 to form a copper film on the aluminum film. The first deposition unit 31 and the second deposition unit 32 may be physical vapor deposition reaction chambers.

In summary, the method for manufacturing a semiconductor layer provided by the present disclosure is not only applicable to metal films, but also applicable to metal nitride films, such as aluminum nitride or titanium nitride. The method is also suitable for nonmetal films, such as silicon oxide or silicon nitride.

In conclusion, the present disclosure provides a method and system for manufacturing a semiconductor layer. After a metal film is formed on the first wafer, the cavity is cooled by an inert gas so that the temperature of the cavity becomes the temperature when the first wafer is provided in the cavity. Then, the second wafer is provided in the cavity to form a metal film on the second wafer. When the second wafer is provided in the cavity, since the temperature of the cavity decreases, the thermal stress of the second wafer is reduced. Therefore, the grain size of the metal film formed on the second wafer becomes smaller, which effectively inhibits the formation of surface defects on the metal film. Through measurement, it is known that the reflectance of the metal film is increased, that is, the defects on the metal film surface are reduced, thus the yield of the resulting semiconductor device is improved. In the present disclosure, the cavity is cooled after being used for a period of time, so that the service life of the cavity can be increased. At the same time, since the deposition time of the metal film is shortened, the output of the metal film can also be improved.

Reference in the specification to "one embodiment", "an embodiment" or "a specific embodiment" means that a particular feature, structure, or characteristic described in connection with an embodiment is included in at least one embodiment of the present disclosure, and may not be in all embodiments. Various appearances of the phrases "in one embodiment", "in an embodiment" or "in a specific embodiment" in various places throughout the specification do not necessarily refer to the same embodiment. Furthermore, the particular features, structures, or characteristics of any specific embodiment may be combined in any suitable manner with one or more other embodiments. It should be understood that other variations and modifications of the embodiments described and illustrated herein may be based on the teachings herein, and are meant to be within the spirit and scope of the present disclosure.

It should also be understood that one or more of the elements shown in the drawings may be implemented in a more separate or integrated manner, or even be removed for being unable to be operated in some cases, or be provided for being useful for a specific application.

Furthermore, unless otherwise indicated, any marking arrows in the drawings should be regarded as merely illustrative and not limiting. Furthermore, unless otherwise indicated, the term "or" as used herein generally means "and/or". In cases where the term is foreseen because it is unclear to provide separation or combination capabilities, the combination of components or operations will also be deemed to have been specified.

As used in the description herein and throughout the claims, unless otherwise stated, "a", "an" and "the" include plural references. Likewise, as used in the description herein and throughout the claims, unless otherwise stated, the meaning of "in" includes "in" and "on".

The above description of illustrated embodiments of the present disclosure, including what is described in the Abstract, is not intended to be exhaustive or to limit the present disclosure to the precise forms disclosed herein. Although specific embodiments and examples of the present disclosure are described herein for illustrative purposes only, various equivalent modifications are possible within the spirit and scope of the present disclosure, as those skilled in the art will recognize and understand. As indicated, these modifications may be made to the present disclosure according to the above description of the embodiments of the present disclosure, and these modifications will be within the spirit and scope of the present disclosure.

Systems and methods have been described in general as an aid to understanding details of the present disclosure. Furthermore, various specific details have been given to provide an overall understanding of the embodiments of the present disclosure. Those skilled in the relevant art will recognize, however, that the embodiments of the present disclosure may be practiced without one or more of the specific details, or with other devices, systems, accessories, methods, components, materials, parts, and so forth. In other instances, well-known structures, materials, and/or operations are not shown or described in detail to avoid obscuring aspects of various embodiments of the present disclosure.

Therefore, although the present disclosure has been described herein with reference to specific embodiments, free modification, various changes and substitutions are intended to be within the above disclosure. It should be understood that, in some cases, without departing from the scope and spirit of the present disclosure, features of the present disclosure can be employed in the absence of corresponding use of other features. Therefore, various modifications may be made to adapt a particular situation or material to the essential scope and spirit of the present disclosure. The present disclosure is not intended to be limited to the specific terms used in the claims and/or specific embodiments disclosed as the best mode contemplated for carrying out the present disclosure. The present disclosure will include any and all embodiments and equivalents falling within the scope of the appended claims. Therefore, the scope of the present disclosure is limited only by the appended claims.

What is claimed is:

1. A method for manufacturing a semiconductor layer, comprising:

placing a first wafer in a cavity, to form a metal film on the first wafer; wherein, before forming the metal film, a temperature inside the cavity is a first temperature;

transferring the first wafer on which the metal film has been formed out of the cavity; wherein, a temperature in the cavity is a second temperature, and the second temperature is greater than the first temperature;

introducing an inert gas into the cavity to cool the cavity, such that the temperature in the cavity is equal to the first temperature;

after the temperature in the cavity is equal to the first temperature, placing a second wafer in the cavity to form the metal film on the second wafer.

2. The manufacturing method according to claim 1, wherein the operations of forming the metal film on the first wafer comprises:

placing the first wafer on a chuck in the cavity;
introducing a gas into the cavity;
depositing the metal film.

3. The method for manufacturing a semiconductor layer according to claim 1, wherein a time to form the metal film on the first wafer is between 50-60 s.

4. The manufacturing method according to claim 1, wherein a thickness of the metal film is between 8000-10000 angstroms.

5. The manufacturing method according to claim 1, wherein the inert gas comprises argon, helium or nitrogen.

6. The manufacturing method according to claim 1, wherein a time to introduce the inert gas into the cavity is between 10-20 s.

7. The manufacturing method according to claim 1, wherein the operation of forming the metal film on the first wafer is identical to the operation of forming the metal film on the second wafer.

8. The manufacturing method according to claim 1, wherein the metal film comprises an aluminum film, a titanium film, or a copper film.

9. The manufacturing method according to claim 1, wherein the first temperature is between 280-300° C., and the second temperature is between 301-350° C.

10. A system for manufacturing a semiconductor layer using the method according to claim 1, comprising:

a deposition unit, comprising a cavity, an external gas source, and a temperature sensing unit;

wherein, the external gas source is provided on the cavity to introduce a gas into the cavity; the temperature sensing unit is provided in the cavity to measure a temperature in the cavity;

wherein, when a first wafer is provided in the cavity, a temperature in the cavity measured by the temperature sensing unit is a first temperature; after a metal film is formed on the first wafer, a temperature in the cavity measured by the temperature sensing unit is a second temperature;

wherein, after the first wafer is removed, an inert gas is introduced into the cavity to cool the cavity; when the temperature in the cavity measured by the temperature sensing unit is equal to the first temperature, a second wafer is placed in the cavity to form the metal film on the second wafer.

* * * * *